United States Patent [19]
Henderson et al.

[11] Patent Number: 5,658,156
[45] Date of Patent: Aug. 19, 1997

[54] ELECTRICAL CONNECTOR AND ALIGNMENT APPARATUS FOR CONTACT PINS THEREFOR

[75] Inventors: Kevin G. Henderson, Gastonia, N.C.; Craig S. Scruggs, Moore, S.C.

[73] Assignee: Thomas & Betts Corporation, Memphis, Tenn.

[21] Appl. No.: 667,320

[22] Filed: Jun. 20, 1996

Related U.S. Application Data

[63] Continuation of Ser. No. 316,019, Sep. 30, 1994, abandoned.
[51] Int. Cl.⁶ .................................................. H01R 9/09
[52] U.S. Cl. .................................................. 439/79
[58] Field of Search .................................. 439/79, 381

[56] References Cited

U.S. PATENT DOCUMENTS

| | | | |
|---|---|---|---|
| 3,404,362 | 10/1968 | Amendola | 439/79 |
| 3,651,444 | 3/1972 | Desso et al. | 439/141 |
| 3,668,476 | 6/1972 | Wrabel et al. | 361/785 |
| 4,134,632 | 1/1979 | Lindberg et al. | 439/79 |
| 4,221,458 | 9/1980 | Hughes et al. | 439/545 |
| 4,710,132 | 12/1987 | Glomb et al. | 439/79 |
| 4,721,472 | 1/1988 | Gentry et al. | 439/79 |
| 4,993,965 | 2/1991 | Eck | 439/381 |
| 5,133,670 | 7/1992 | Doi et al. | 439/79 |
| 5,191,514 | 3/1993 | Kabat et al. | 361/415 |
| 5,201,661 | 4/1993 | Li | 439/79 |
| 5,213,514 | 5/1993 | Arai | 439/79 |
| 5,219,295 | 6/1993 | Niwa et al. | 439/79 |
| 5,340,320 | 8/1994 | Puerner | 439/79 |
| 5,350,307 | 9/1994 | Takagishi et al. | 439/79 |
| 5,354,207 | 10/1994 | Chikano | 439/79 |

OTHER PUBLICATIONS

IBM Technical Disclosure Bulletin, vol. 31 No. 5, pp. 122–124, Oct. 1988.

*Primary Examiner*—Gary F. Paumen
*Attorney, Agent, or Firm*—Michael L. Hoelter; Salvatore J. Abbruzzese

[57] ABSTRACT

Alignment apparatus for aligning contact pins exiting an electrical connector comprises an elongate body of electrically insulative material having a generally flat base defining a plurality of passages opening into respective upper and lower surfaces of the base portion, first projections integral with the body and extending upwardly of the base upper surface, the first projections being disposed interiorly of longitudinally opposed end margins of the body, and second projections integral with the body and extending upwardly of the base upper surface, the second projections being cantilever-supported by the base such that free ends of the second projections distal from the base upper surface may occupy positions variable longitudinally of the base. The first projections provide for registration of the alignment apparatus with a connector and are adjacent longitudinally opposed margins of the apparatus. The second projections include latching structure at the free ends thereof for mating with complemental latching structure of a connector.

16 Claims, 2 Drawing Sheets

ELECTRICAL CONNECTOR AND ALIGNMENT APPARATUS FOR CONTACT PINS THEREFOR

This application is a continuation of application Ser. No. 08/316,019 filed on Sep. 30, 1994 now abandoned.

FIELD OF THE INVENTION

This invention relates generally to electrical connectors and more particularly to contact pin alignment apparatus for electrical connectors.

BACKGROUND OF THE INVENTION

A requirement for contact pins of a wide variety of electrical connectors is a high degree of flexibility. For example, so-called "right angle headers" require contact pins to have a ninety degree bend in order to interface a female output connector to a printed circuit board (PCB). Such contact pin flexibility gives rise, however, to difficulties in aligning the PCB connection ends of the contact pins with a pattern of PCB plated-through holes for connection of the header to traces on the PCB.

The art has extensively addressed the difficulty with various forms of alignment apparatus securable either to a connector or to a PCB, such as are shown in U.S. Pat. Nos. 3,651,444, 4,721,472 and 5,133,670. A quite simple alignment apparatus is shown in *IBM Technical Disclosure Bulletin*, Vol. 31, No. 5, October 1988, pp. 122–124, wherein alignment apparatus for mounting on a PCB comprises a flat, elongate electrically insulative body with a plurality of contact alignment passages therethrough and snap-in projections extending from the body undersurface to secure the same to a PCB.

SUMMARY OF THE INVENTION

The present invention has as its primary object the provision of improved contact pin alignment apparatus.

A particular object of the invention is to provide contact pin alignment apparatus for ready association with a connector to align contact pins as they exit the connector.

A further object of the invention is the provision of an improved electrical connector embodying contact pin alignment apparatus.

In attaining these and other objects, the invention provides alignment apparatus for aligning contact pins exiting an electrical connector comprising an elongate body of electrically insulative material having a generally flat base defining a plurality of passages opening into respective upper and lower surfaces of the base portion, first projections integral with the body and extending upwardly of the base upper surface, the first projections being disposed interiorly of longitudinally opposed end margins of the body, and second projections integral with the body and extending upwardly of the base upper surface, the second projections being cantilever-supported by the base such that free ends of the second projections distal from the base upper surface may occupy positions variable longitudinally of the base.

The first projections provide for registration of the alignment apparatus with a connector and are substantially immobile relative to the base. The second projections include latching structure at the free ends thereof for mating with complemental latching structure of a connector.

An electrical connector in accordance with the invention has a housing comprised of electrically insulative material and a plurality of contact pins extending from the housing through an exit channel of the housing, the housing having first and second portions bounding the housing channel and defining respective first and second recesses in an undersurface of the housing. The alignment apparatus is registered with the housing through residence of the first projections in the first and second housing recesses. The second projections of the alignment apparatus are resident in the housing channel and are respectively in engagement with the housing first and second portions.

The foregoing and other objects and features of the invention will be further understood from the following detailed discussion of preferred practices and embodiments thereof and from the drawings wherein like reference numerals identify like components and parts throughout.

DETAILED DESCRIPTION OF PREFERRED EMBODIMENTS

Figure 1:
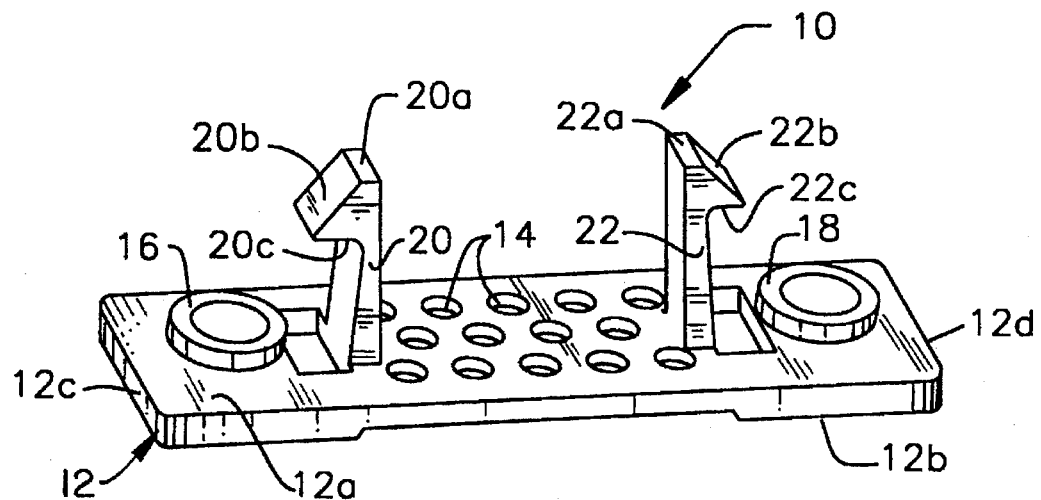
FIG. 1 is a perspective view of alignment apparatus in accordance with the invention.
Figure 2:
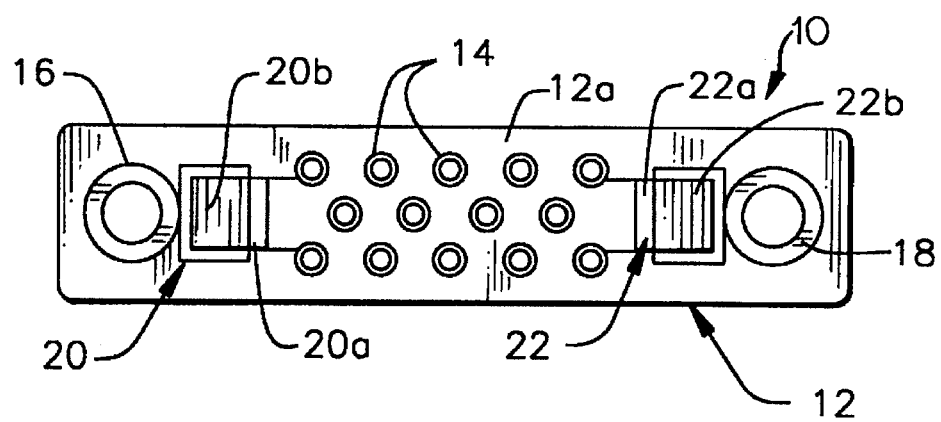
FIG. 2 is plan view of the FIG. 1 apparatus.
Figure 3:
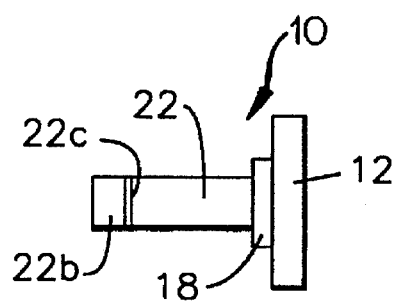
FIG. 3 is side view of FIG. 2.

Referring to FIGS. 1–3, alignment apparatus 10 comprises an elongate body of electrically insulative material, such as molded plastic, having a generally flat base 12 defining a plurality of passages 14 opening into upper 12a and lower 12b surfaces of base 12. Lower surface 12b is centrally undercut in its expanse in registry with passages 14.

First projections 16 and 18 are integral with base 12 and extend upwardly of base upper surface 12a. Projections 16 and 18 are disposed interiorly of longitudinally opposed end margins 12c and 12d of base 12 and are preferably of cylindrical configuration, as indicated in FIGS. 1 and 2. Nesting recesses are formed in the undersurface of a connector with which apparatus 10 is used for receiving projections 16 and 18, such that apparatus 10 and the connector are properly positionally registered, i.e., connector contact pins are aligned with passages 14.

Second projections 20 and 22 are also integral with base 12 and also extend upwardly of base upper surface 12a. Projections 20 and 22 are cantilever-supported by base 12, such that free ends 20a and 22a thereof distal from base upper surface 12a may occupy positions variable longitudinally of base 12. More particularly, the second projections have camming surfaxes 20b and 22b at free ends 20a and 22a. As the camming surfaces engage connector surfaces, they displace free ends 20a and 22a increasingly toward one another as wedging action occurs as between camming surfaces 20b and 22b and the connector surfaces. Upon completion of the wedging action, detent ledges 20c and 22c engage connector interior surfaces as projections 20 and 22 return to their relaxed dispositions shown in FIG. 1.

First projections 16 and 18 have extent upwardly of base upper surface 12a less than extent of second projections 20 and 22 upwardly thereof and, unlike the latter, are substantially immobile relative to the base. The second projections are disposed longitudinally interiorly of the first projections.

Turning to FIGS. 4–7, they show alignment apparatus 10 in retentive relation to connector 24. Connector 24 comprises an electrically insulative housing 26 having upper contact pin row 28, middle contact pin row 30 and lower contact pin row 32. As is seen particularly in FIG. 5, each contact pin row has contacts bent at ninety degrees, such that connector 24 can mate with another connector (not shown) having three horizontally disposed socket rows and interconnect the socket rows with a PCB (not shown).

Figure 6:
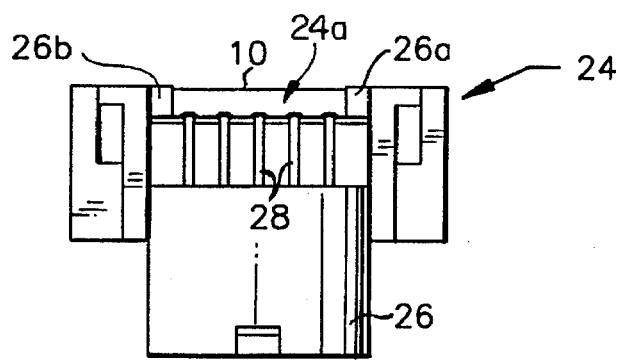
FIG. 6 is a plan view of the FIG. 4 connector.
Figure 4:
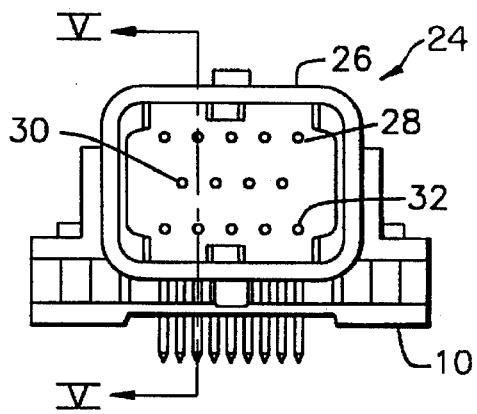
FIG. 4 is a front view of a connector in accordance with the invention.
Figure 7:
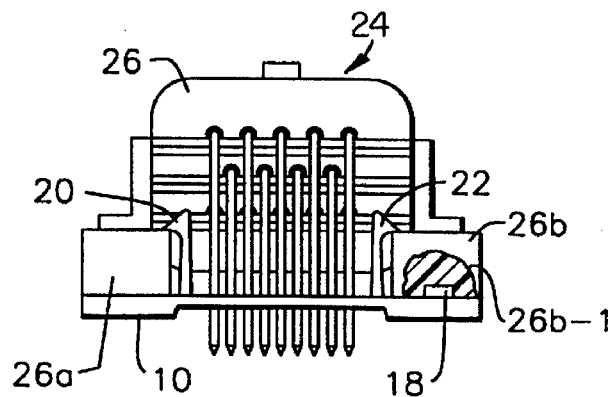
FIG. 7 is a rear view of the FIG. 4 connector, broken away in part to show interior detail.
Figure 5:
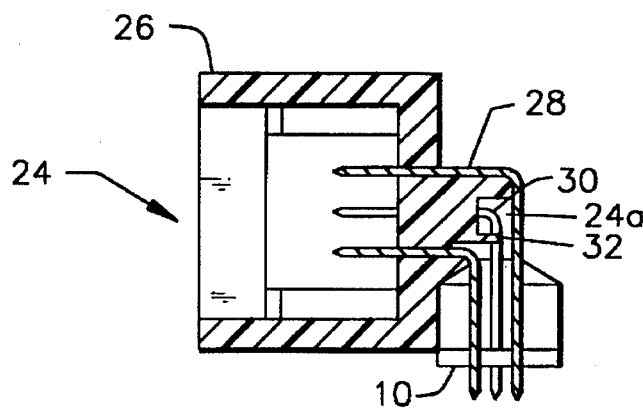
FIG. 5 is a sectional view of the FIG. 4 connector as would be seen from plane V—V of FIG. 4.

As is seen in FIGS. 5 and 6, the contact pins exit housing 26 through a rearward channel 24a opening bounded on opposite sides respectively by housing portions 26a and 26b. The interior surfaces of housing portions 26a and 26b are the connector surfaces for effecting the wedging action of projections 20 and 22, above discussed in connection with FIGS. 1–3. The upper surfaces of housing portions 26a and 26b are the connector surfaces above referred to as engaging detent ledges 20c and 22c, such retentive engagement being seen in FIG. 7. At their undersurfaces, housing portions 26a and 26b define the above-discussed recesses for receiving projections 16 and 18, recess 26b-1 being shown with projection 18 in the broken away portion of FIG. 7.

Various changes to the particularly disclosed alignment apparatus and connector may evidently be introduced without departing from the invention. Accordingly, it is to be appreciated that the particularly discussed and depicted preferred embodiments and practices of the invention are intended in an illustrative and not in a limiting sense. The true spirit and scope of the invention are set forth in the ensuing claims.

What is claimed is:

1. Alignment apparatus for aligning contact pins exiting an electrical connector, said alignment apparatus comprising an elongate body of electrically insulative material having a generally flat base defining a plurality of passages opening into respective upper and lower surfaces of said base, first projections integral with said body and extending upwardly of said base upper surface, said first projections being disposed interiorly of longitudinally opposed end margins of said body, and second projections integral with said body and extending upwardly of said base upper surface, said second projections being cantilever-supported by said base such that free ends of said second projections distal from said base upper surface may occupy positions which positions are variably locatable longitudinally of said body.

2. The apparatus claimed in claim 1, wherein said second projections define latching structure at said free ends thereof.

3. The apparatus claimed in claim 1, wherein said first projections extend upwardly from said base less than said second projections extend upwardly from said base.

4. The apparatus claimed in claim 3, wherein said second projections are substantially immobile relative to said base.

5. The apparatus claimed in claim 1 wherein said second projections are disposed longitudinally interiorly of said first projections.

6. The apparatus claimed in claim 5, wherein said second projections define latching structure at said free ends thereof.

7. The apparatus claimed in claim 5, wherein said first projections extend upwardly from said base less than said second projections extend upwardly from said base.

8. The apparatus claimed in claim 7, wherein said second projections are substantially immobile relative to said base.

9. In combination:
   (a) an electrical connector having a housing comprised of electrically insulative material and a plurality of contact pins extending from said housing through an exit channel of said housing, said housing having first and second portions bounding said housing channel and defining respective first and second recesses in an undersurface of said housing; and
   (b) alignment apparatus for aligning said connector contact pins as they exit said connector, said alignment apparatus comprising an elongate body of electrically insulative material having a generally flat base defining a plurality of passages opening into respective upper and lower surfaces of said base portion, said contact pins being resident individually in said passages, first projections integral with said body and extending upwardly of said base upper surface, said first projections being disposed interiorly of longitudinally opposed end margins of said body and being resident in said housing first and second recesses, and second projections integral with said body and extending upwardly of said base upper surface, said second projections being cantilever-supported by said base and being resident in said channel and respectively in engagement with said housing first and second portions and securing said alignment apparatus to said connector housing.

10. The invention claimed in claim 9, wherein said second projections define latching structures respectively at said free ends thereof, each latching structures being in retentive engagement with different ones of said housing first and second portions.

11. The apparatus claimed in claim 9, wherein said first projections extend upwardly from said base less than said second projections extend upwardly from said base.

12. The invention claimed in claim 11, wherein said second projections are substantially immobile relative to said base.

13. Alignment apparatus for aligning contact pins exiting an electrical connector, said alignment apparatus comprising an elongate body of electrically insulative material having a generally flat base defining a plurality of passages opening into respective upper and lower surfaces of said base, first means extending upwardly of said base upper surface for securing said alignment apparatus to said connector and second means extending upwardly of said base upper surface for positioning said alignment apparatus with respect to said connector, said first means being cantilever supported by said base, said second means being immobile with respect to said base.

14. In combination:
   (a) an electrical connector having a housing comprised of electrically insulative material and a plurality of contact pins extending from said housing; and
   (b) alignment apparatus for aligning said connector contact pins, said alignment apparatus comprising an elongate body of electrically insulative material having a generally flat base defining a plurality of passages opening into respective upper and lower surfaces of said base, said contact pins being resident individually in said passages, first means extending upwardly of said base upper surface and for securing said alignment apparatus to said connector and second means extending upwardly of said base upper surface for positioning said alignment apparatus with respect to said connector, said first means being cantilever-supported by said base, said second means being immobile with respect to said base.

15. The invention claimed in claim 14, wherein said first means comprises projections having extent upwardly of said base greater than the extent of said second means upwardly of said base.

16. The invention claimed in claim 15, wherein said second means comprises projections extending upwardly of said base.

* * * * *